(12) United States Patent
Williams (10) Patent No.: US 7,154,976 B2
(45) Date of Patent: Dec. 26, 2006

(54) FREQUENCY CONTROLLER

(75) Inventor: Kalvin Williams, Thatcham (GB)

(73) Assignee: LSI Logic Corporation, Milpitas, CA (US)

( * ) Notice: Subject to any disclaimer, the term of this patent is extended or adjusted under 35 U.S.C. 154(b) by 841 days.

(21) Appl. No.: 10/230,565

(22) Filed: Aug. 29, 2002

(65) Prior Publication Data
US 2004/0041947 A1    Mar. 4, 2004

(51) Int. Cl.
*H04L 7/00*    (2006.01)

(52) U.S. Cl. ..................................... 375/371

(58) Field of Classification Search ........ 348/536–538, 348/54; 327/156–159; 375/371, 373, 334–336; 324/76.24; 331/11
See application file for complete search history.

(56) References Cited

U.S. PATENT DOCUMENTS

| | | | | |
|---|---|---|---|---|
| 3,956,585 A * | 5/1976 | Butler et al. | ................. | 348/614 |
| 4,164,628 A * | 8/1979 | Ward et al. | ................. | 375/150 |
| 4,368,434 A * | 1/1983 | Miller et al. | ................. | 329/336 |
| 4,423,519 A * | 12/1983 | Bennett, Jr. et al. | ........ | 375/324 |
| 4,494,012 A * | 1/1985 | Coker | ..................... | 307/132 E |
| 5,222,084 A * | 6/1993 | Takahashi | .................... | 370/290 |
| 5,889,436 A * | 3/1999 | Yeung et al. | .................. | 331/2 |
| 6,356,158 B1 * | 3/2002 | Lesea | .......................... | 331/11 |
| 6,424,138 B1 * | 7/2002 | Brownstein | ............. | 324/76.24 |
| 6,510,191 B1 * | 1/2003 | Bockelman | ................. | 375/371 |
| 6,512,555 B1 * | 1/2003 | Patel et al. | ................. | 348/726 |
| 6,542,040 B1 * | 4/2003 | Lesea | .......................... | 331/11 |
| 6,724,334 B1 * | 4/2004 | Tzelnick | ..................... | 341/144 |
| 6,775,342 B1 * | 8/2004 | Young et al. | ................ | 375/371 |
| 7,088,796 B1 * | 8/2006 | Djahanshahi et al. | ........ | 375/376 |
| 7,095,993 B1 * | 8/2006 | You et al. | ................ | 455/192.2 |
| 2003/0099321 A1 * | 5/2003 | Juan et al. | ................... | 375/376 |

* cited by examiner

*Primary Examiner*—Paulos M. Natnael
(74) *Attorney, Agent, or Firm*—Christopher P. Maiorana, P.C.

(57) ABSTRACT

The invention may relate to a digital frequency adjuster for adjusting a first frequency of a first signal. The digital frequency adjuster may comprise a first digital delay line and a first control circuit. The first digital delay line may comprise a plurality of taps. The first digital delay line may be configured to (i) receive the first signal and (ii) generate a second signal. The first control circuit may be configured to control dynamic assertion of respective ones of the taps at a rate such that the second signal has a second frequency different from the first frequency of the first signal.

22 Claims, 7 Drawing Sheets

STATE DIAGRAM:

RULES
FROM ANY GIVEN STATE:
1. FOLLOW A TRANSITION LINE WHEN THE LABEL DESCRIBES A TRUE CONDITION.
2. WHEN A TRANSITION HAS NO LABEL, FOLLOW THE TRANSITION UNCONDITIONALY ON THE NEXT CLOCK TRANSITION.
3. WHEN THERE MAY BE NO VALID TRANSITION TO BE TAKEN, REMAIN IN THE CURRENT STATE.
4. "." INDICATES A LOGICAL AND FUNCTION.
5. "!" INDICATES A LOGICAL INVERSE FUNCTION.

FREQUENCY CONTROLLER

FIELD OF THE INVENTION

The invention may relate to a frequency controller, for example, for a clock generator. The invention may be especially suitable for use in a receiver for digital television broadcasts (for example, a digital TV set or a digital set top box (STB)) for controlling the frequency of a clock used for synchronizing decoding of a broadcast signal. However, the invention is not limited only to such an application.

BACKGROUND TO THE INVENTION

A digital TV broadcaster, adhering to the Digital Video Broadcast specification, broadcasts pictures using a program clock reference (PCR) based on a 27 MHZ clock frequency, with an error of +/−810 Hz. To accurately reproduce the broadcast program within a receiver, the same clock frequency must be generated within the receiver using a local clock oscillator. Samples of a broadcaster's (PCR) are broadcast at intervals to facilitate frequency synchronization of the local clock oscillator. Failure to maintain synchronization at the receiver would result in some audio and video data being lost (never presented) or repeated (as the receiver waits for more).

A conventional approach to implementing the local clock oscillator is to use a voltage controlled crystal oscillator (VCXO). Control logic in the receiver processes received samples of the PCR, and processes values derived from a local clock counter clocked by the local clock oscillator, to determine whether the local clock frequency is synchronized to the PCR. If not, then a control voltage applied to the VCXO is adjusted to either increase, or decrease, the VCXO frequency, to thereby increase the counting rate of the local clock counter (if the counting rate is slightly slower than the received PCR samples), or to decrease the counting rate of the local clock counter (if the counting rate is slightly faster than the received PCR samples).

However, a VCXO circuit is generally difficult to design, due to the large number of variables within its analog circuitry. Guaranteeing a predetermined frequency operating range of the VCXO is difficult. For the above reason, the VCXO is generally separate from, and not integrated into, a decoder integrated circuit. Furthermore, the VCXO represents a significant cost within the circuitry of the receiver. The cost becomes even more significant in a receiver with a multiple (i.e., dual) broadcast reception capability. Each channel may include a slightly different PCR frequency, and so corresponding multiple local clocks have to be generated and synchronized, one for each broadcast channel to be received or decoded. A separate VCXO has to be employed for each channel, to provide an independently controllable clock for that channel.

SUMMARY OF THE INVENTION

The invention may relate to a digital frequency adjuster for adjusting a first frequency of a first signal. The digital frequency adjuster may comprise a first digital delay line and a first control circuit. The first digital delay line may comprise a plurality of taps. The first digital delay line may be configured to (i) receive the first signal and (ii) generate a second signal. The first control circuit may be configured to control dynamic assertion of respective ones of the taps at a rate such that the second signal has a second frequency different from the first frequency of the first signal.

Features, objects and advantages of the invention may generally include: (i) enabling the use of a simple, low cost oscillator; (ii) facilitating implementation of a frequency adjuster in an integrated circuit; and/or (iii) enabling multiple clock frequencies for multiple channels to be generated easily from a common local oscillator. Further features, objects and advantages of the invention will become apparent from the following description, claims and drawings.

BRIEF DESCRIPTION OF THE DRAWINGS

A preferred embodiment of the invention is now described, by way of example only, with reference to the appended claims and accompanying drawings, in which:

DETAILED DESCRIPTION OF THE PREFERRED EMBODIMENT

Figure 1:
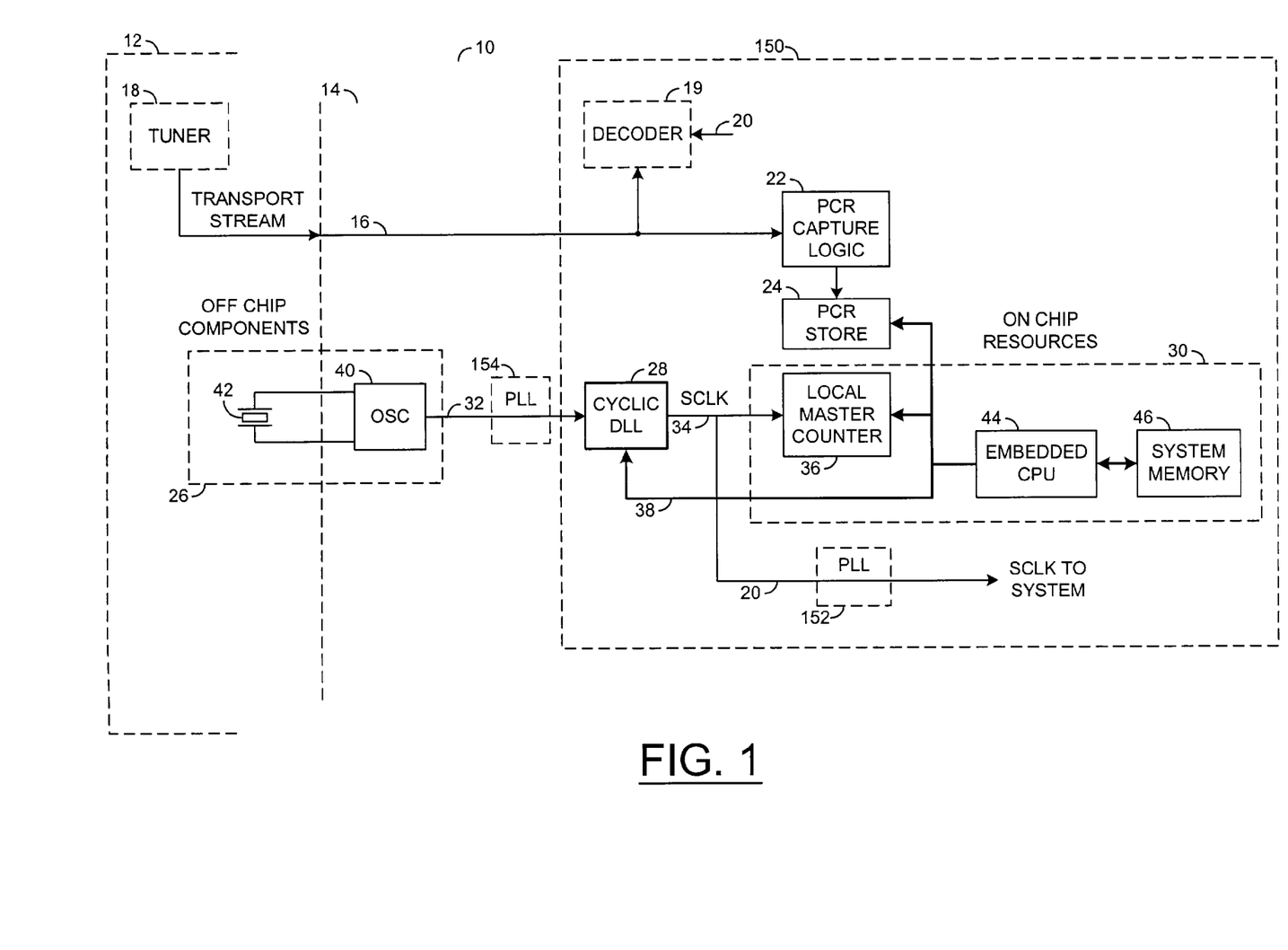
FIG. 1 is a schematic block diagram of functional parts of a clock generation and synchronization system for a digital TV receiver.

FIG. 1 generally represents functional parts of a clock generation and synchronization system 10 for a digital TV receiver 12. For example, the receiver may be included in a digital TV set, a digital STB, or in another digital television-related apparatus. The system 10 may be at least partly included in an integrated circuit 14, although one or more parts or components of the system 10 may be external to the integrated circuit 14. The system 10 may receive a transport stream 16 from a tuner section 18 of the receiver 12. The tuner section 18 may be at least partly integrated into the same integrated circuit 14 as the system 10, or it may be a separate circuit. For the sake of generality, the transport stream 16 may be shown in FIG. 1 as being received as a signal external to the integrated circuit 14. The integrated circuit 14 may also include a decoder circuitry 19 responsive to a system clock signal 20 generated by the system 10, or such decoder circuitry 19 may be external to the integrated circuit 14.

The system 10 may generally comprise capture logic 22 for capturing samples of a broadcast PCR from the transport stream 16. Captured PCR samples may be stored in a PCR store 24 and may be used for synchronizing the system clock signal 20, as described below. The system 10 may generally further comprise a local oscillator 26, a frequency adjuster 28, and a control system (second control circuit) 30. The local oscillator 26 may generate a first clock signal 32 having a generally fixed frequency. The frequency adjuster 28 may be operable to generate a second clock signal (e.g., SCLK) 34 from the first clock signal 32, having an adjusted or "pulled" frequency, in order to fine-tune the system clock signal 20 derived from the second clock signal 34. The control system 30 may generally function to generate an adjustment control signal 38 for controlling the frequency adjuster 28, in order to synchronize the frequency of the second clock signal 34 to the broadcast PCR. In particular, the control system 30 may generally control the frequency adjuster 28 such that a (first) count rate of a local master counter 36 clocked by the second clock signal 34 may be generally synchronized with a (second) count rate (or speed) of the broadcast PCR. The count rate of the broadcast PCR may be determined by calculating a PCR-difference between two consecutively captured PCR samples. The PCR-difference may be calculated each time that a new PCR sample may be captured into the store 24. The count rate of local master counter 36 may be determined by calculating a local-difference between values of the local master counter 36 captured at times corresponding to the capture times of the PCR samples. For example, each time a PCR sample may be captured, the control system 30 may calculate the PCR-difference and the local-difference, and may compare the values of the two differences. The two values may be equal indicating that the second clock frequency 34 may be correctly synchronized with the broadcast clock frequency. The local-difference may be smaller than the PCR-difference indicating that the frequency of the second clock signal 34 may be slightly lower than the broadcast clock frequency. The control system 30 may be responsive to control the frequency adjuster 28 to increase the frequency of the second clock signal 34. The local-difference may be greater than the PCR-difference indicating that the frequency of the second clock signal 34 may be slightly higher than the broadcast clock frequency. The control system 30 may be responsive to control the frequency adjuster 28 to decrease the frequency of the second clock signal 34. The adjustment control signal 38 may have a magnitude dependent on the amount of disagreement between the first and second differences. The adjustment control signal 38 may have a sign (for example, a positive or a negative sense) depending on whether the second clock signal 34 may be increased or decreased in frequency with respect to the first clock signal 32.

The local oscillator 26 may generally comprise an oscillator circuit 40 coupled to a crystal 42. The oscillator circuit 40 may be integrated within the integrated circuit 14. The crystal 42 may be external to the integrated circuit 14. The crystal may, for example, be a sole functional component, or one of a minority of functional components, of the system 10 that are external to the integrated circuit 14. The frequency of the first clock signal 32 may be fixed by the crystal 42. The control system (second control circuit) 30 may generally comprise the local master counter 36, a processor 44 and system memory 46. The system memory 46 may function to store data and/or software executed by the processor 44 to perform the control functions described above. The processor 44 may be dedicated to the system 10, or may perform other control and/or decoding tasks (not described).

Figure 2:
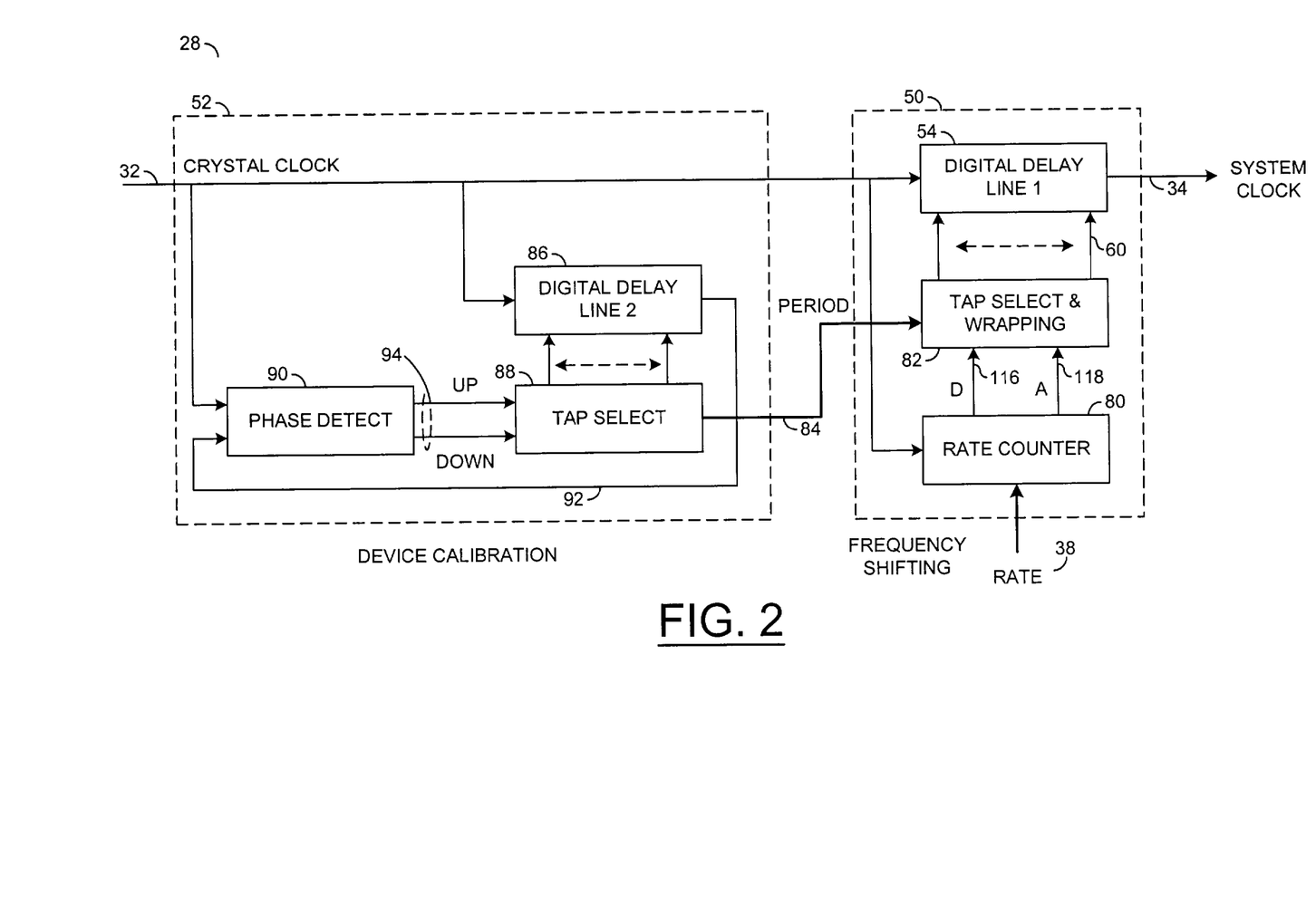
FIG. 2 is a block diagram of a frequency adjuster of FIG. 1.
Figure 3:
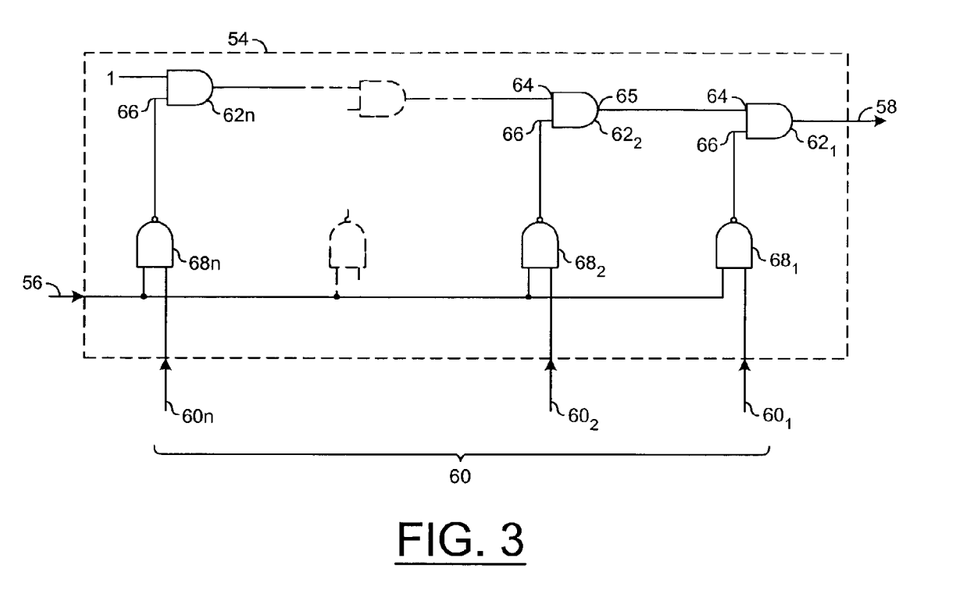
FIG. 3 is a block diagram of a digital delay line of FIG. 2.

Referring to FIG. 2, the frequency adjuster 28 may generally comprise a frequency shifter 50 and a calibration circuit 52. The calibration circuit 52 may be used for calibrating the frequency shifter 50, as described below. If calibration is not required, the calibration circuit may be omitted. However, calibration may provide optimum performance of the system. The frequency shifter 50 may generally comprise a first digital delay line 54 that may be controlled to provide a frequency shifting effect. The first digital delay line 54 may be independent of the local oscillator 26. Referring to FIG. 3, the first digital delay line 54 may generally have an input 56, a delayed output 58, and a tap control input 60 for controlling tap insertion positions of the delay line 54 between the input 56 and the output 58. The tap control input 60 may include a respective enable input $60_{1 \ldots n}$ for each of "n" tap insertion positions in the delay line 54. The delay line 54 may generally comprise a plurality of delay stages defined by gates $62_{1 \ldots n}$. The gates 62 may, for example, be AND gates. The delay stages may have a uniform delay, or the delay may vary in magnitude from one delay stage to another. The aggregate delay of all of the delay stages in the first digital delay line may be at least equal to a period of the first clock signal 32, and preferably longer (to allow for tolerances). A first input 64 of each gate 62 may be coupled to an output 65 of a preceding gate 62 in the delay line 54. The gate $62_n$ that is most remote from the output 58 in the delay line 54 may coupled to a logical-1 signal. A second input 66 of each gate 62 may be coupled to an output of a respective tap gate $68_{1 \ldots n}$. The tap gates 68 may function to control the tap insertion points in the delay line 54 at which the signal from the input 56 may be applied or inserted. The applied signal may then ripple through the series of gates 62 to the output 58, being delayed by the propagation delay associated with each gate 62. The tap gates 68 may, for example, be NAND gates. The signal from the input 56 of the delay line 54 may be coupled in parallel to an input of each of the tap gates 68, and each respective tap control signal 60 may be coupled to another input of the respective tap gate 68. By asserting one tap control signal $60_{1 \ldots n}$, the signal from the input 56 may be applied or inserted at a corresponding one tap position in the delay line 54, which may result in a corresponding single pulse at the output 58, delayed according to the number of delay stages between the tap position and the output 58. By asserting multiple tap control signals $60_{1 \ldots n}$, the signal from the input 56 may be applied or inserted at corresponding multiple tap positions in the delay line 54, which may result in plural delayed output pulses separated by a delay corresponding to the propagation delay between the multiple tap positions.

Figure 4:
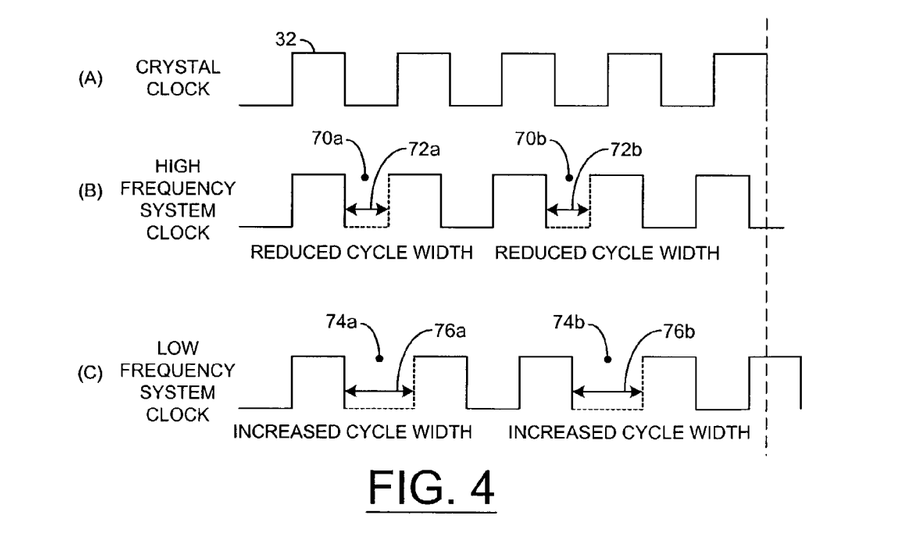
FIG. 4 is a schematic illustration showing modification of a clock frequency by a cyclic digital delay unit of FIG. 2.

Referring again to FIG. 2, a concept of the frequency shifter 50 using the digital delay line 54 may take advantage of a relatively small amount by which the frequency of the first clock signal 32 is to be "pulled" to generate the second clock frequency 32. For example, depending on the crystal 42, the amount of "pulling" may be about +/−150 ppm. The concept may also take advantage of a relatively small amount of delay that the first digital delay line 54 allows to be added to, or removed from, a signal. Typically, the amount of delay produced at each delay stage (gate 62) in the delay line 54 may be about 50–120 ps (pico-seconds), for example, about 100 ps. A principle of the concept may be to periodically increase or decrease the delay created by the digital delay line 54. The delay line 54 may thus effectively change the frequency by changing a pulse width of an occasional clock period, while maintaining the pulse width of others. Over a set period of time, one or more clock cycles may either be added to or removed from the signal by changing the period of occasional cycles. This principle may be illustrated in FIG. 4. FIG. 4(*a*) may illustrate the first clock signal 32. While the delay of the delay line 54 may be maintained constant, the second clock signal 34 generally matches the first clock signal (delayed by an arbitrary delay of the delay line 54). Referring to FIG. 4(*b*), if the delay of the delay line 54 may be occasionally reduced (e.g., at points 70*a* and 70*b*), a width of a clock cycle 72*a*, 72*b* at which each reduction 70 occurs may be reduced. The delay may be reduced by moving the tap insertion position in a direction towards the output 58. For example, at point 70*a*, the insertion tap in the delay line 54 may be changed from $60_1$ to $60_{i-1}$, and at point 70b, the insertion tap in the delay line 54 may be changed from $60_{1-1}$ to $60_{i-2}$, where "i" represents an arbitrary insertion tap, for example, near a mid-position of the delay line 54. Referring to FIG. 4(c), if the delay of the delay line 54 may be occasionally increased (e.g., at points 74a and 74b), a width of a clock cycle 76a, 76b at which each increase 74 occurs may be increased. The delay may be increased by moving the tap insertion position in a direction away the output 58. For example, at point 74a, the insertion tap in the delay line 54 may be changed from $60_i$ to $60_{i+1}$, and at point 74b, the insertion tap in the delay line 54 may be changed from $60_{i+1}$ to $60_{i+2}$, where "i" again represents an arbitrary insertion tap, for example, near a mid-position of the delay line 54.

Figure 5:
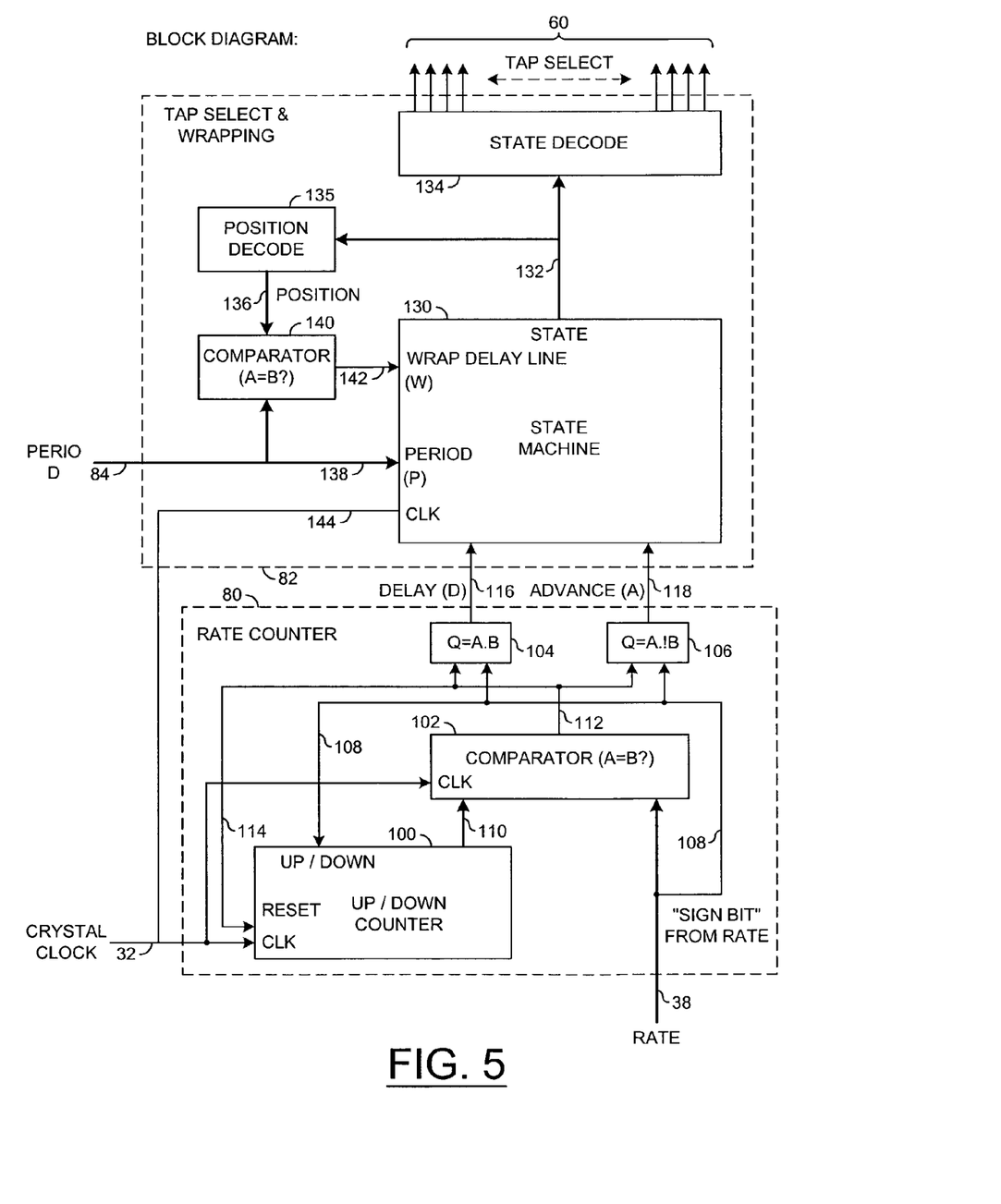
FIG. 5 is a more detailed block diagram of part of the frequency adjuster of FIG. 2.

Referring again to FIG. 2, the frequency shifter 50 may further generally comprise a first control circuit comprising a rate counter 80 for controlling the rate at which the delay of the digital delay circuit 54 may be successively increased or decreased, in accordance with the adjustment signal (e.g., RATE) 38 from the control system 30. Referring to FIG. 5, the rate counter 80 may generally comprise an up/down counter 100, a comparator 102, a first control gate 104, and a second control gate 106. The up/down counter 100 may be clocked by the first control signal 32, and the count direction may be controlled by a sign "bit" 108 of the control signal 38 from the control system 30. The comparator 102 may receive the control signal 38 and a count output 110 from the up/down counter 100, and may compare these two values. Each time that the count value may reach the value defined by the control signal 38, the comparator may assert an output 112 indicative that the tap position of the first delay line 54 should be moved (e.g., either to increase the delay, or to decrease the delay). The output 112 may be fed back to a reset input 114 of the up/down counter 100 to reset the count value. The output 112 may be fed to inputs of the first and second control gates 104 and 106, which may also receive the sign bit 108. In response to the output 112 being asserted, a respective one of the control gates 104 and 106 may assert a respective output signal, depending on the value of the sign bit 108. The sign bit 108 may be provided as a non-inverted input to the first control gate 104, and as an inverted input to the second control gate 106. If the sign bit may have a first value (e.g. positive), the first gate 104 may generate a first delay signal (e.g., D) 116 indicative that the tap position of the first delay line 54 should be delayed (e.g., increased delay). If the sign bit 108 may have a second value (e.g. negative), the second gate 106 may generate a second advance signal (e.g., A) 118 indicative that the tap position of the first delay line 54 should be advanced (e.g., reduced delay).

Referring again to FIG. 2, the frequency shifter 50 may further generally comprises tap select and wrapping control circuitry 82 for generating respective tap control inputs 60 to generate delay increases, or decreases, responsive to the first delay signal 116 and to the second advance signal 118. Since the length of the delay line is not infinite, the present embodiment may take advantage of cyclically wrapping the tap control inputs 60 to within a single period of the first clock signal 32. For example, if a certain delay "d" may be larger than a period "P" of the first clock signal 32, the equivalent signal may be obtained by "wrapping" to a delay time d−P (where P may be a period of the first clock signal 32). The function of the calibration circuit 52 may be to provide a signal 84 indicating the tap position of the delay line 54 which corresponds to the period P of the first clock signal. The delay of each clock stage in the delay line 54 may vary due to one or more of manufacturing tolerances, ageing, and environmental conditions of the circuit in use, for example, temperature. Provision of the calibration circuit 52 may enable the tap position corresponding to the period P to be determined accurately and automatically. The calibration circuit 52 may also provide continuous monitoring in case the determined tap position may change in use.

The calibration circuit 52 may generally comprise a second digital delay line 86, and a third control circuit generally comprising a tap position selector 88 and a phase detector 90. The second digital delay line 86 may be closely matched to the first digital delay line 54 in terms of one or more of manufacturing tolerances, age and environmental conditions. The second digital delay line 86 may comprise circuits similar to the first delay line 54 as described above. The second delay line 86 may be coupled to receive the first clock signal 32 as an input, and a delayed output 92 may be coupled to an input of the phase detector 90. The phase detector 90 may also receive the first clock signal 32 as a direct input. The function of the phase detector 90 may be to detect whether the phase of the delayed signal 92 leads, or lags, the first clock signal 32. The phase detector 90 may generate control signals 94 for controlling the tap position selector 88 to move the tap position in a direction to reduce the phase difference between the delayed signal 92 and the first clock signal 32. The tap position may eventually settle at a delay which may be closest to a full period P of the first clock signal 32. Such automatic settling may be guaranteed by the design of the circuit 52. The tap position selector 88 may generate the signal 84 indicative of which tap position corresponds to a full period P of the first clock signal 32.

Figure 6A:
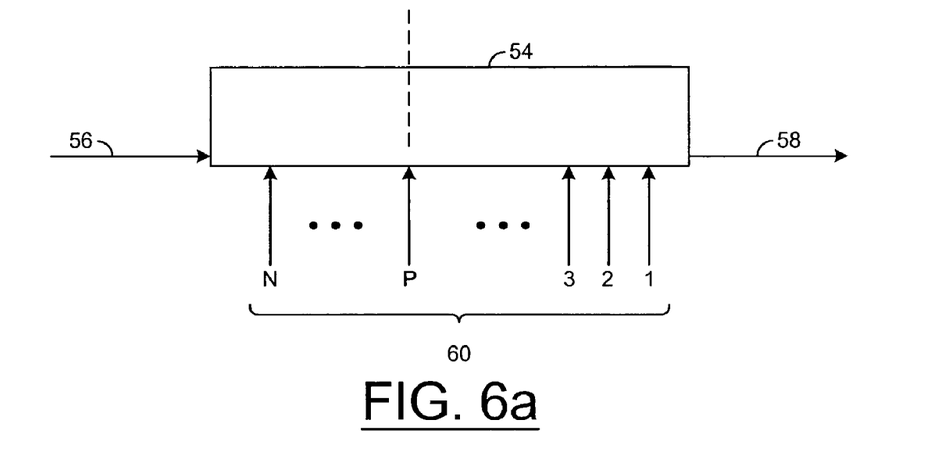
FIG. 6 is a schematic illustration representing wrapping of the digital delay line.
Figure 6B:
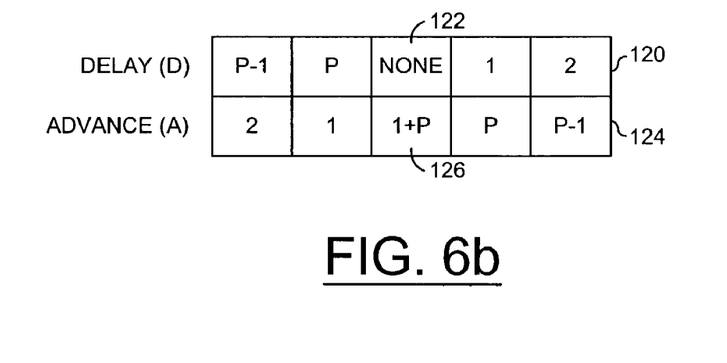

FIG. 6 may illustrate the principles of wrapping of the delay of the first delay line 54, and of selecting appropriate sequences of tap insertion positions 60 of the first delay line 54. For example, from an arbitrary tap position in FIG. 6a, the delay may be increased by moving the tap insertion position 60 progressively further away from the output 58 (for example, to the left in FIG. 6a). When the tap insertion position reaches a first wrap position "P" (corresponding to a full period "P" of the first clock signal 32), the tap position may "wrap" back to the first tap insertion position "1" (second wrap position). However, as indicated in a sequence 120 in FIG. 6b, a "rest" cycle 122 may be included in the sequence of tap insertion positions when an increasing-delay wrap occurs. During the rest cycle 122, no tap insertion point may be selected. Rest cycle 122 may allow time for the previous signal at the tap insertion position "P" to ripple through the delay line 54, and appear at the output 58 (which may take a full time period "P" to ripple to the output 58). Similarly, the delay may be decreased by moving the tap insertion position 60 progressively nearer to the output 58 (for example, to the right in FIG. 6a). When the tap insertion position reaches the second wrap position "1", the tap position may "wrap" to the full period (first wrap) position "P". However, as indicated in the sequence 124 in FIG. 6b, a "dual" cycle 126 may be included in the sequence of tap insertion positions when an decreasing-delay wrap occurs. During the dual cycle 126, two tap insertion points may be selected, for example, the first position "1" and the full period position "P". Selecting two tap insertion positions may enable the delay line 54 to be loaded with an appropriate time spacing of pulses, so that no discontinuity may appear at the output 58 when the selected tap position eventually selects only the full period position "P" as the next cycle in the wrap sequence. The first and second wrap positions may be selected to be any tap insertion positions separated by an aggregate delay corresponding approximately to a full period P of the first clock signal 32. The position of one of the wrap positions may be predetermined (e.g. the second wrap position "1" as above), and the position of the other wrap position may be determined according to the signal from the 84 from the calibration circuit 52. Alternatively, the positions of both wrap positions may be derived from information from the calibration circuit 52. The wrapping principles discussed may be applied to any integer multiple of the full repetition period P of the first signal 32, and the first and second wrap positions may be defined accordingly.

Referring again to FIG. 5, the tap select and wrapping control circuitry 82 for selecting the appropriate one or more tap insertion positions in response to the delay (D) and the advance (A) control signals 116 and 118 may generally comprise a state machine 130, a state decoder 134, a position decoder 135 and a comparator 140. The function of the state machine 130 may be to generate a predetermined sequence of state signals 132 in response to the control signals 116, 118, the period position signal 84, and an output 142 of the comparator 140. Each state signal 132 may represent a predetermined configuration of one or more enabled tap positions of the delay line 54. The state decoder 134 may decode (expand) the state signal 132 into the plurality of tap control signals 60 for controlling the first delay line 54. The position decoder 135 may decode the state signal 132 to represent a notional "position" 136 of a selected tap (similar to that represented in FIG. 7). The comparator 140 may function to compare the decoded position 136 with the full period position signal 84, to determine whether a wrap may be needed. If the decoder position 136 may match the full period position signal 83, then the comparator may assert a wrap signal (e.g., W) 142 to the state machine 130. The position decoder 134 may be configured such that, if the state signal 132 represents multiple tap insertion points, then a null or "zero" position may be indicated. The null position may avoid multiple "wrap" signals 142 being asserted during the dual insertion cycle 126 of the wrap sequence 124 of FIG. 6.

Figure 7:
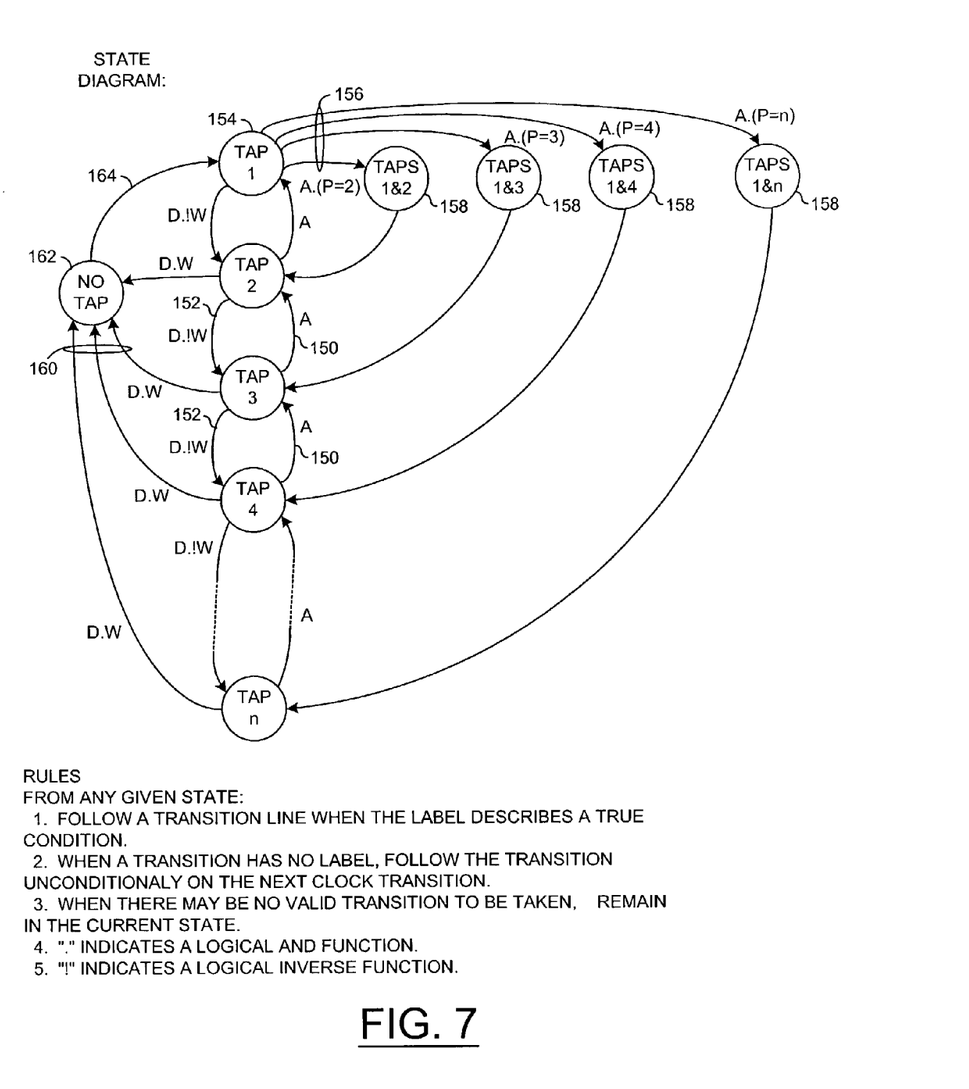
FIG. 7 is a schematic state diagram illustrating operation of a state machine of FIG. 5.

FIG. 7 may represent the sequences of different state signal 132 that may be generated by the state machine 130 in response to different combinations of the input signals: delay control (D) 116; advance control (A) 118; full period (P) 84 and wrap (W) 142. State transitions may be governed by one or more of the following rules, which may apply to any given starting state:
(a) Follow a transition line when the label describes a TRUE condition;
(b) When a transition has no label, follow the transition unconditionally on the next clock transition;
(c) Where there may be no valid transition to be taken, remain in the current state;
(d) "." indicates a logical AND function;
(e) "!" indicates a logical INVERSE function.

The state transitions of FIG. 7 may be similar to those illustrated in FIG. 6, but may take into account that the full period position "P" may not be the same from one device to another, since the full period position "P" may depend on characteristics of the delay line 54, as described previously. The state transitions may generally include advance transitions 150 for sequencing progressively towards the initial tap position "1" 154 to reduce the delay in response to an advance control signal (A) 118. Thereafter, in response to a further advance control signal (A) 118, the state may transition on a path 156 to one of the dual states 158 for selecting dual tap positions, depending on the value of the full period position signal (P) 84. The state transitions may also generally include delay (retard) transitions 152 for sequencing progressively away from the initial tap position "1" 154 to increase the delay in response to a delay control signal (D) 116. When the tap position reaches the full period position (P), the input "W" 142 may be asserted, so that the condition D.W may become TRUE. Thereafter, in response to a further delay control signal (D) 116, the state may transition on a path 160 to a "no tap" state 162, and thereafter to the initial tap position state 154.

Figure 8:
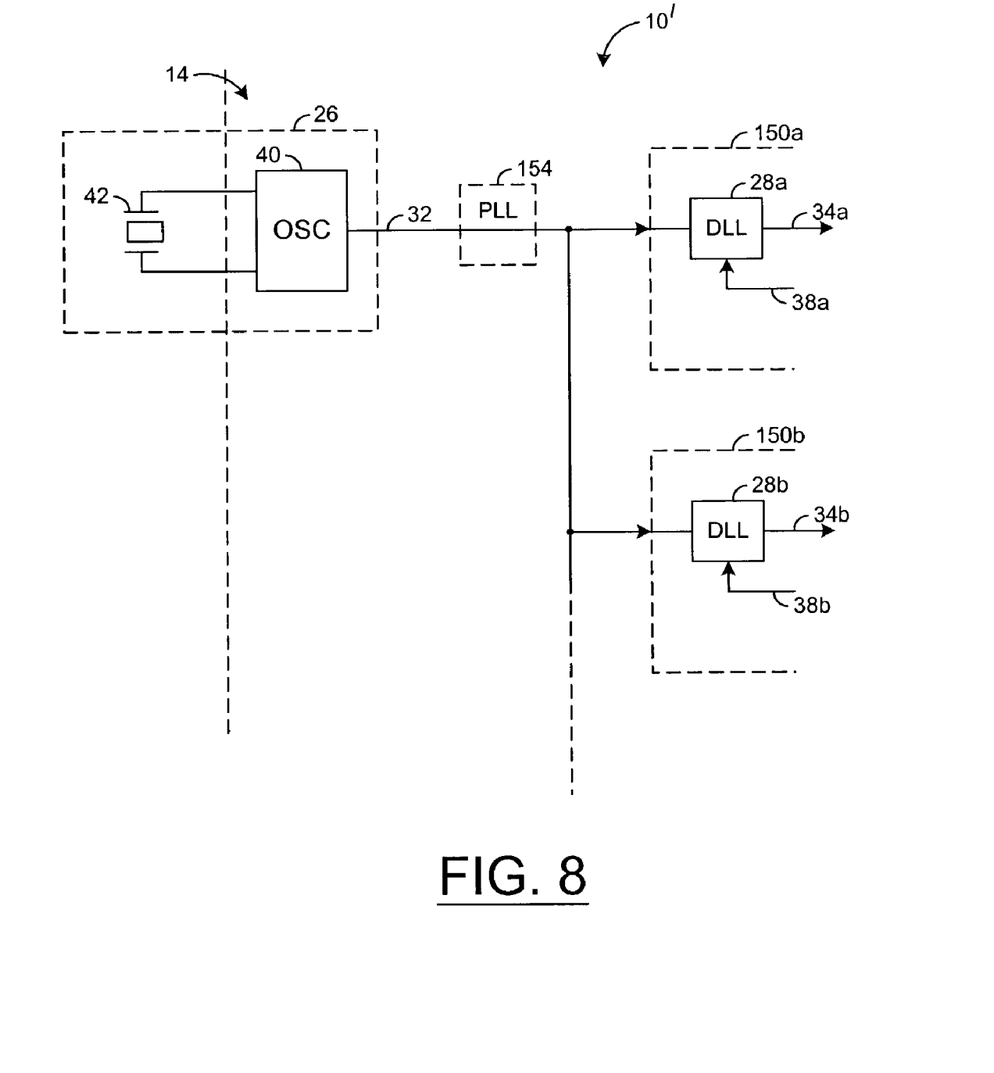
FIG. 8 is a schematic diagram illustrating extension of the circuit of FIG. 1 for multiple channel use.

FIG. 8 may illustrate how the principles of the above embodiment may be employed in a timing and synchronization control system 10' for multiple broadcast channels. For example, the multiple channels may include a first channel generally denoted by the suffix "a", and a second channel generally denoted by the suffix "b". The system 10' may include a single oscillator 26 as described previously, generating a common first control signal 32 for the multiple channels. Each channel may include circuitry 150, that may generally include the elements bounded by the box 150 in FIG. 1. In particular, each channel 150a-b may include a respective frequency adjuster 28, for generating a dedicated adjusted second clock signal 34 for the respective channel. The arrangement of FIG. 8 may be advantageous in that a single oscillator 26 may be used for multiple channels. Also, the oscillator 26 may be relatively straightforward in design, and at least a major portion of the oscillator 26 may be conveniently integrated into the integrated circuit 14 containing the system 10'.

As indicated by the broken line 152 in FIG. 1, a phase-locked loop (PLL) may be employed to multiply the frequency of the system clock 20 to a multiple of the second clock frequency 34 synchronized to the PCR. A higher frequency may facilitate high speed operation of the decoder 20. Where the circuit block 150 may be employed in the multi-channel arrangement of FIG. 8, each channel may include a dedicated PLL down stream of a respective frequency adjuster 28. As a modification either of the arrangement of FIG. 1, or of the arrangement of FIG. 8, a PLL 154 may alternatively be inserted directly following the oscillator 26. The frequency of the second clock signal may then be based on a multiple of the frequency of the first clock signal 32, yet still be synchronized to the or each PCR. A potential advantage of placing the PLL directly after the oscillator 26 and upstream of the circuit blocks 150 is that the period of the clock signal inputted to the circuit blocks 150 may be shortened, such that few delay stages may be used in the digital delay lines to generate an aggregate delay equal to a period of the clock signal. Also, in the multi-channel arrangement of FIG. 8, only a single PLL 154 may be used. To compensate for the higher frequency, the rate counters 80 used in the frequency adjusters 28 may have a higher number of bits.

The invention, particularly as described in the preferred embodiment, may enable a tunable clock frequency to be generated using a relatively simple, low cost crystal oscillator. Most of the circuitry described above may be integrated, to reduce the number of external components. Additionally, multiple tunable clocks for a multi-channel system may be generated easily from a single local oscillator, which may further yield cost advantages.

The foregoing description is merely illustrative of a preferred form of the invention. Various modifications, improvements and equivalents may be used without departing from the scope and/or principles of the invention. Accordingly, the appended claims are to be construed to cover all such modifications, improvements and equivalents.

The invention claimed is:

1. A digital frequency adjuster for adjusting a first frequency of a first signal, the digital frequency adjuster comprising:
a first digital delay line comprising a plurality of taps arranged as inputs, wherein said first digital delay line is configured to (i) receive said first signal and (ii) generate a second signal; and
a first control circuit configured to control dynamic assertion of respective ones of said taps at a rate such that said second signal has (i) in a first condition said first frequency and (ii) in a second condition a second frequency different from said first frequency of said first signal.

2. The digital frequency adjuster according to claim 1, wherein said first digital delay line has an aggregate delay length at least as long as a repetition period of said first signal.

3. The digital frequency adjuster according to claim 1, wherein in said second condition said first control circuit is further configured to periodically assert respective ones of said taps to periodically reduce a delay of said first digital delay line, thereby to cause said second frequency of said second signal to be higher than said first frequency of said first signal.

4. The digital frequency adjuster according to claim 1, wherein in said second condition said first control circuit is further configured to periodically assert respective ones of said taps to periodically increase a delay of said first digital delay line, thereby to cause said second frequency of said second signal to be lower than said first frequency of said first signal.

5. The digital frequency adjuster according to claim 1, wherein said first control circuit is further configured to assert said taps cyclically.

6. A digital frequency adjuster for adjusting a first frequency of a first signal, the digital frequency adjuster comprising:
a first digital delay line comprising a plurality of taps and configured to (i) receive said first signal and (ii) generate a second signal; and
a first control circuit configured to control dynamic assertion of respective ones of said taps at a rate such that said second signal has a second frequency different from said first frequency of said first signal, wherein said taps include a first wrap position and a second wrap position.

7. The digital frequency adjuster according to claim 6, wherein a length of an aggregate delay between said first wrap position and said second wrap position is approximately an integer multiple of a repetition period of said first signal.

8. The digital frequency adjuster according to claim 6, wherein said first control circuit is further configured to assert said taps in a sequence of: said first wrap position; a no tap position; and said second wrap position.

9. The digital frequency adjuster according to claim 6, wherein said first control circuit is further configured to assert said taps in a sequence of: said second wrap position; both said first wrap position and said second wrap position; and said first wrap position.

10. The digital frequency adjuster according to claim 1, wherein said first control circuit comprises a state machine defining a state transition function.

11. The digital frequency adjuster according to claim 1, further comprising a second control circuit configured to (i) process said second signal and (ii) generate an adjustment control signal for controlling said first control circuit to synchronize said second frequency of said second signal to a reference signal.

12. A digital frequency adjuster for adjusting a first frequency of a first signal, the digital frequency adjuster comprising:
a first digital delay line comprising a plurality of taps and configured to (i) receive said first signal and (ii) generate a second signal;
a first control circuit configured to control dynamic assertion of respective ones of said taps at a rate such that said second signal has a second frequency different from said first frequency of said first signal; and
a counter clocked by said second signal.

13. The digital frequency adjuster according to claim 1, further comprising a calibration circuit configured to generate a third signal for determining at least one of (i) a first wrap position of said taps and (ii) a second wrap position of said taps.

14. The digital frequency adjuster according to claim 13, wherein said calibration circuit comprises:
a second digital delay line comprising a plurality of second taps arranged as inputs; and
a second control circuit configured to selectively assert respective ones of said second taps for determining which of said second taps corresponds to a delay approximately equal to a repetition period of said first signal.

15. The digital frequency adjuster according to claim 1, wherein said digital frequency adjuster is implemented in an integrated circuit.

16. The digital frequency adjuster according to claim 1, wherein said digital frequency adjuster is implemented in a processor for processing a digital television signal, and said digital frequency adjuster is configured to generate said second signal synchronized to a reference frequency of a program clock reference in said digital television signal.

17. A circuit for generating multiple, independently adjustable, clock frequencies from a reference signal having a reference frequency, the circuit comprising:
a first frequency adjuster configured to generate a first signal having a first frequency from said reference signal, said first frequency adjuster comprising:
a first digital delay line comprising a plurality of first taps and configured to (i) receive said reference signal and (ii) generate said first signal; and
a first control circuit configured to control said first taps of said first digital delay line for controlling said first frequency of said first signal; and
a second frequency adjuster configured to generate a second signal having a second frequency from said reference signal, said second frequency adjuster comprising:
a second digital delay line comprising a plurality of second taps and configured to Ci) receive said reference signal and (ii) generate said second signal; and
a second control circuit configured to control said second taps of said second digital delay line for controlling said second frequency of said second signal.

18. The circuit according to claim 17, wherein said circuit is implemented in a processor for processing multiple digital television channel signals, said first frequency of said first signal being synchronizable to a first program clock reference of a first digital television signal channel, and said second frequency of said second signal being synchronizable to a second program clock reference of a second digital television signal channel.

19. A method of adjusting a first frequency of a first signal, the method comprising the steps of:
(A) receiving said first signal by a digital delay line comprising a plurality of delay taps arranged as inputs;
(B) generating a second signal from said digital delay line; and
(C) controlling respective ones of said delay taps at a rate such that said second signal has (i) in a first condition said first frequency and (ii) in a second condition a second frequency different from said first frequency of said first signal.

20. A digital frequency adjuster for adjusting a first frequency of a first signal, comprising:

means for (i) receiving said first signal, (ii) receiving a control signal at a plurality of delay taps arranged as inputs and (iii) generating a second signal; and
means for controlling respective bits of said control signal at a rate such that said second signal has a second frequency different from said first frequency of said first signal.

21. The digital frequency adjuster according to claim 6, wherein said first control circuit is further configured to periodically assert respective ones of said taps to wrap a delay of said first digital delay line between said first wrap position and said second wrap position.

22. The digital frequency adjuster according to claim 12, further comprising a processor generating an adjustment control signal to synchronize a first count rate of said counter to a second count rate from a reference signal.

* * * * *